United States Patent
Nishida et al.

(10) Patent No.: US 8,802,974 B2
(45) Date of Patent: Aug. 12, 2014

(54) SOLAR CELL

(75) Inventors: Yasutaka Nishida, Tokyo (JP);
Michihiko Inaba, Kanagawa-ken (JP);
Shinya Sakurada, Tokyo (JP); Satoshi Itoh, Ibaraki-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/565,849

(22) Filed: Sep. 24, 2009

(65) Prior Publication Data

US 2010/0078072 A1   Apr. 1, 2010

(30) Foreign Application Priority Data

Sep. 26, 2008 (JP) ................. 2008-248757

(51) Int. Cl.
*H01L 31/032* (2006.01)
(52) U.S. Cl.
CPC ........ *H01L 31/0321* (2013.01); *H01L 31/0323* (2013.01)
USPC ............................ 136/262; 136/264; 136/265
(58) Field of Classification Search
None
See application file for complete search history.

(56) References Cited

U.S. PATENT DOCUMENTS

2006/0102230 A1* 5/2006 Tuttle ............................ 136/265
2006/0112984 A1   6/2006 Walukiewcz et al.

FOREIGN PATENT DOCUMENTS

JP   11-087750   * 3/1999   ............. H01L 31/04

OTHER PUBLICATIONS

Alonso, M. I. et al. Optical functions of chalcopyrite CuGaxIn1—xSe2 alloys. Applied Physics A. (2002) vol. 74, p. 659-664.*
Chen, S, et al Band-structure anomalies of the chalcopyrite semiconductors CuGaX2 versus AgGaX2 (X=S and Se) and their alloys, Physical Review B. (2007), vol. 75, 205209.*
Kronick, L. et al. Interface redox engineering of Cu(In,Ga)Se2-based solar cells: oxygen, sodium, and chemical bath effect. Thin Solid Films (2000), vol. 361-362, p. 353-359.*
Gossla, M et al, Five-source PVD for the deposition of Cu(In1_xGax)(Se1_ySy)2 absorber layers. Thin Solid Films 480-481 (2005) 33-36.*
Hanna et al, Solar conversion efficiency of photovoltaic and photoelectrolysis cells with carrier multiplication absorbers. Journal of Applied Physics, (2006), vol. 100, p. 074510.*
Machine translation of JP 11-087750 to Wanatabe et al provided by Japanese Patent Office.*

(Continued)

*Primary Examiner* — Jennifer Michener
*Assistant Examiner* — Christopher Danicic
(74) *Attorney, Agent, or Firm* — Amin, Turocy & Watson, LLP

(57) ABSTRACT

A solar cell includes a p-n junction formed by joining a p-type semiconductor and an n-type semiconductor. The p-type semiconductor is a chalcopyrite compound semiconductor with a band gap of 1.5 eV or more within which an intermediate level exists with a half bandwidth of 0.05 eV or more. The intermediate level is different from an impurity level. The chalcopyrite compound semiconductor includes a first element having first electronegativity of 1.9 or more in Pauling units, the first element occupying a lattice site of the semiconductor. A portion of the first element is substituted with a second element having second electronegativity different from the first electronegativity, the second element being a congeneric element of the first element. The intermediate level is created by substituting the first element with the second element.

4 Claims, 8 Drawing Sheets

7 EXTRACTION ELECTRODE
6 TRANSPARENT ELECTRODE (ZnO,Al)
5 n-TYPE SEMICONDUCTOR LAYER (CdS,InS,ZnS)
8 BUFFER LAYER
4 OPTICAL ABSORPTION LAYER (CuGaS$_{2-x}$O$_x$, AgAlS$_{2-x}$O$_x$, CuAlS$_{2-x}$O$_x$)
3 Mo FILM METAL ELECTRODE
2 EXTRACTION ELECTRODE
1 SUBSTRATE (SODA LIME GLASS)

(56) References Cited

OTHER PUBLICATIONS

Albornoz, J. et al. "Electrical and optical characterization of oxygen doped CuInSe2 crystals." Crystal Research and Technology 34, No. 9 (1999): 1191-1196.*

B. Tell, et al.; Electrical Properties, Optical Properties, and Band Structure of CuGaS2 and CuInS2, Physical Review B, vol. 4, No. 8, Oct. 15, 1971, pp. 2463-2471.

K. M. Yu, et al.; Diluted II-VI Oxide Semiconductors with Multiple Band Gaps, Physical Review Letters, vol. 91, No. 24, Dec. 12, 2003, pp. 246403-1-246403-4.

Miguel A. Contreras, et al.; Diode Characteristics in State-of-the-Art ZnO/CdS/Cu(In1—xGax)Se2 Solar Cells, Progress in Photovoltaics: Research and Applications, 2005, 13:209-216.

Antonio Luque, et al.; Increasing the Efficiency of Ideal Solar Cells by Photon Induced Transitions at Intermediate Levels, Physical Review Letters, vol. 78, No. 26, Jun. 30, 1997, pp. 5014-5017.

William Shockley, et al.; Detailed Balance Limit of Efficiency of p-n Junction Solar Cells, Journal of Applied Physics, vol. 32, No. 3, Mar. 1961, pp. 510-519.

Japanese Office Action for Japanese Application No. 2008-248757 mailed on Mar. 13, 2012.

* cited by examiner

AgGaS2-x Ox

AgGaSe2-x Ox

AgInS2-x Ox

AgInSe2-x Ox

US 8,802,974 B2

SOLAR CELL

CROSS REFERENCE TO RELATED APPLICATION

This application is based upon and claims the benefit of priority from the Japanese Patent Application No. 2008-248757, filed on Sep. 26, 2008, the entire contents of which are incorporated herein by reference.

FIELD OF THE INVENTION

The present invention relates to a solar cell employing chalcopyrite compound semiconductors, the solar cell having high photoelectric-conversion efficiency.

DESCRIPTION OF THE BACKGROUND

In current enhancement of aspiring to environment-conscious manufacturing techniques, regenerable and inexhaustible energy sources are becoming more important. Photovoltaic generation using solar light, i.e., clean energy is environment-compatible, and has been extensively studied not only for basic researches but also for practical-application researches.

Photovoltaic generation converts solar light (visible light) into electrical energy. Conversion efficiency is one of indicators of the performance of a photovoltaic material, while it is a significant challenge to achieve high conversion efficiency for low costs and practical applications of solar cells. Single-crystalline silicon, polycrystalline silicon and amorphous silicon are currently regarded as a comparatively suitable material as the photovoltaic material. The eminently suitable materials include a chalcopyrite compound semiconductor with high conversion efficiency.

The chalcopyrite compound semiconductor is a direct-transition type semiconductor, generally having higher optical absorption properties than indirect-transition type semiconductors. It has been reported that the chalcopyrite compound semiconductor showed conversion efficiency up to 19% (Prog. Photov. Res. Appl. 13 (2005) 209), thus allowing it to regard the chalcopyrite compound semiconductor as a potentially suitable material for solar cells.

It is possible to provide the chalcopyrite compound semiconductor with a wide variety of band gaps. It is known that the band gap of the chalcopyrite type compound semiconductor typified by Cu(In, Ga)Se$_2$ can be controlled by the combination of the constituent elements thereof, thereby enabling it to form an energy gap of about 1.4 eV corresponding to the average energy of visible light. This allows it to obtain higher conversion efficiency of the solar cell employing the chalcopyrite type compound semiconductor.

The chalcopyrite compound semiconductors with different energy gaps may be laminated to form a tandem cell, thereby allowing it to absorb light with different wave lengths, the enhancement of the conversion efficiency being thus expected.

When the conversion efficiency is reviewed for the typical materials such as Si currently used for a single solar cell, the single crystal Si, polycrystalline Si and amorphous Si have conversion efficiencies of 25%, 20% and 13%, respectively. III-V compound semiconductors such as GaAs show a conversion efficiency of 31.5%, and II-VI compound semiconductors such as CdS show 16%, as reported. Thus, a high conversion-efficiency means about 30% at the highest.

III-V compound semiconductors have a comparatively high conversion-efficiency, while the upper limit of the conversion efficiency thereof has been evaluated theoretically for such a single solar cell with a single gap. The theoretical evaluation reports that the upper limit is 40.7% under an ideal condition (Phys. Rev. Lett. 78, 5014 (1997), J. Appl. Phys. 32, 510 (1961)), suggesting that the conversion efficiency for the single solar cell may be enhanced just by controlling the energy gap to reach up to about 40% at the highest. Therefore, in order to acquire the conversion efficiency exceeding the theoretical value, a semiconductor device and a designing method thereof, being less conventional, are desired.

SUMMARY OF THE INVENTION

According to a first aspect of the invention, a solar cell includes a p-n junction formed by joining a p-type semiconductor and an n-type semiconductor. The p-type semiconductor is a chalcopyrite compound semiconductor with a band gap of 1.5 eV or more within which an intermediate level exists with a half bandwidth of 0.05 eV or more. The intermediate level is different from an impurity level.

According to a second aspect of the invention, the solar cell is provided with the chalcopyrite compound semiconductor including a first element having first electronegativity of 1.9 or more in Pauling units, the first element occupying a lattice site of the semiconductor. Furthermore, a portion of the first element is substituted with a second element having second electronegativity different from the first electronegativity, the second element being a congeneric element of the first element. In addition, the intermediate level is created by substituting the first element with the second element.

According to a third aspect of the invention, the solar cell is provided with the p-type semiconductor having a chemical formula of ABC$_2$. "A" represents a chemical symbol for copper or silver. "B" represents a chemical symbol for any one of gallium, indium and aluminum. "C" represents a chemical symbol for sulfur or selenium.

According to a fourth aspect of the invention, the solar cell is provided with the n-type semiconductor including at least one of cadmium sulfide (CdS), zinc selenide (ZnSe), zinc oxide (ZnO) and zinc sulfide (ZnS). In addition, a surface of the n-type semiconductor is further provided with a transparent electrode including at least one of zinc oxide, indium oxide and tin oxide.

BRIEF DESCRIPTION OF DRAWINGS

The accompanying drawings, which are incorporated in and constitute a part of this specification, illustrate embodiments of the invention and together with the description, serve to explain the principles of the invention.

DETAILED DESCRIPTION OF THE EMBODIMENTS

The present inventors have executed a material design theoretically using a first principles calculation and have found out the following items.

Figure 1:
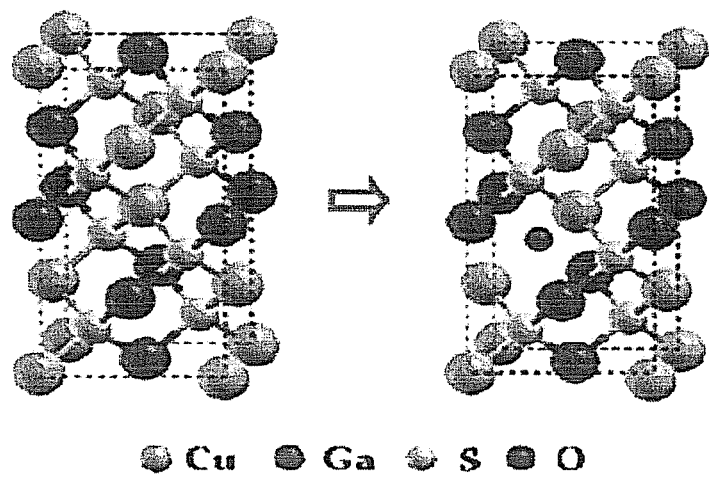
FIG. 1 is a view showing atomic structure models of a chalcopyrite compound

The first principles calculation is a nonempirical calculation technique on the basis of density functional theory, and accurately calculates electronic states for a real material. A atomic configuration of sulfide semiconductor $CuGaS_2$ with a portion of sulfur S thereof substituted with O is shown as an example of the calculations. FIG. 1 is a view showing atomic structure models of a chalcopyrite compound ($CuGaS_2$) and a substituted system $CuGaS_{2-x}O_x$ (x=0.25) whose base material is the chalcopyrite compound. Lattice constants and atom sites were derived from a related document (Phys. Rev. B4, 2463 (1971)).

The left side of FIG. 1 shows the atomic structure model of the compound not substituted, and the right side thereof shows the atomic structure model of the compound substituted. An influence of ion cores is taken into the calculation using pseudopotential, and the wave function of a valence electron is expanded with plane waves to execute the calculation. It was assumed for accuracy of the calculation that:
a cut-off energy of the wave function was 30 Rydberg;
a cut-off energy of charge density was 300 Rydberg;
a wave number k was sampled by dividing into a mesh of 4×4×4;
a convergence condition of energy per atom was set to $10^{-6}$ Hr (1 Hr=27.2 eV); and
a convergence condition of interatomic forces was set to $10^{-3}$ Hr/Bohr.

In the right side of FIG. 1, one of eight Ss within a primitive unit cell is substituted with O (referred to as the "oxygen-substitution" hereinafter), thereby the substitution rate corresponding to 12.5%. It has been found out that sulfur can be substituted with oxygen so that oxygen fell into place of sulfur owing to an optimization of the crystal-lattice structure, although the atomic radius of oxygen is quite different from that of sulfur. Concerning lattice distortions due to the oxygen-substitution, the first principles molecular dynamics method resulted in lattice distortions of 2% and 4% in the c-axis direction and in the (a, b)-plane direction, respectively. It is considered that less amount of the oxygen-substitution causes less lattice mismatch.

Figure 2A:
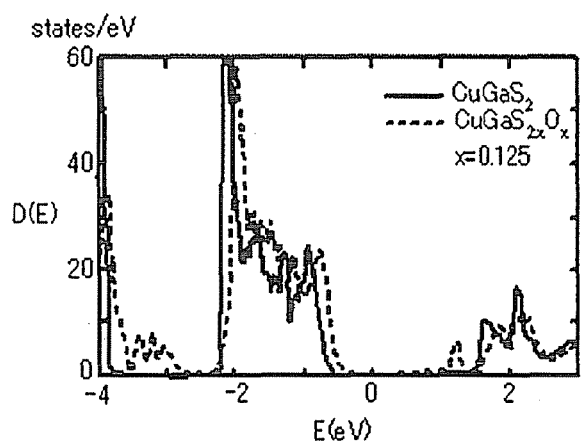
FIG. 2 is a graph showing state densities and atomic structure models of a chalcopyrite compound.
Figures 2B, 2C:
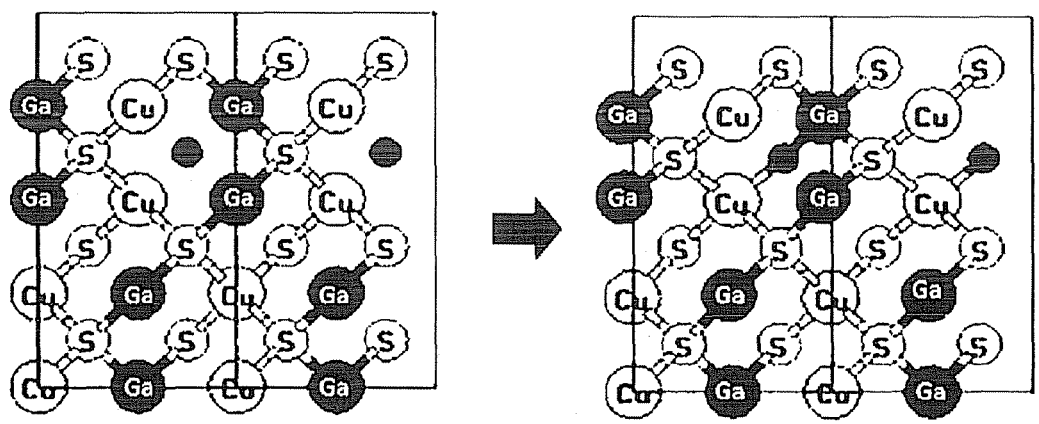
Figure 3:
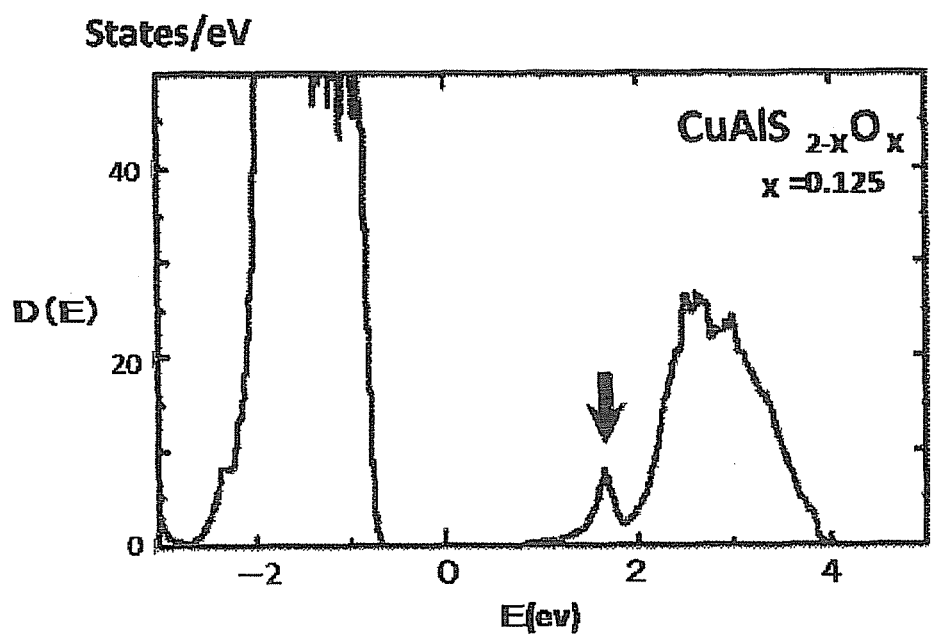
FIGS. 3 to 12 are graphs showing the calculations of density of states for various candidate compounds.

FIG. 2A is a graph showing calculated state densities for $CuGaS_2$ before and after the oxygen-substitution. The vertical and horizontal axes represent energy (eV) and states number (states/eV), respectively, and the original point is set to Fermi level. The solid-line curve in the figure shows the calculation for the unsubstituted system, the energy gap being estimated at 1.98 eV. When this value 1.98 eV is compared with a measured one 2.43 eV, the error is approximately 70% and within an empirical error of the first principles calculation. A change from FIG. 2B to FIG. 2C shows a lattice relaxation due to the oxygen substitution. According to the calculation, the lattice is distorted by 2% and 4% in the c-axis direction and in the (a, b)-plane direction, respectively. It is considered that a p-type semiconductor is less influenced by a lattice mismatch due to lamination.

An analysis on a chalcopyrite compound $ABC_2$ with a portion of sulfur C=S thereof substituted with O (oxygen) is shown as the broken line curve of FIG. 2A. When the state densities are compared between the compounds with and without the oxygen substitution, it should be noted that the oxygen substitution creates an intermediate level within the energy gap. The inventors have found out that it is possible to create a multi-gap state in the single solar cell. The chalcopylite semiconductor is referred to as the "CIS" compound, because the examples of the chalcopylite semiconductor includes $\underline{Cu}\underline{In}Se_2$, $\underline{Cu}\underline{In}S_2$, $\underline{Cu}(\underline{In}_{1-x}Ga_x)Se_2$, etc. That is, A=Cu, B=In and C=S or Se are established for $ABC_2$. That is, when the VI element of the CIS chalcopyrite compound is substituted with more electronegative congener, an intermediate energy level is created. The intermediate level is different from an impurity level, thus enabling it to make the multi-gap state in the single solar cell. The creation of the intermediate level can be understood on the basis of these results as follows.

The first principles calculation suggests that the formation of the gap of the unsubstituted CIS compound is due to the formation of both the bonding state and anti-bonding state that a d-electron of the I-element (A=Cu, Ag) and a p-electron of the VI-element (C=S, Se) make. When a portion of the VI-element is substituted with the congener electronegative atom (oxygen), p-electron of the oxygen forms the anti-bonding state combined with the I-element (A=Cu, Ag). Oxygen is considered to be more electronegative than the intrinsic constituents S and Se, thus occupying an atomic-orbital level relatively deeper than the levels of S and Se, viewed from the atomic-orbital levels of the I-elements such as Cu and Ag. As a result, the state of anti-bonding between the p-orbital of oxygen and the I-elements such as Cu and Ag due to the oxygen substitution is partially extracted from the conduction band of the matrix CIS, shifting to a lower energy side. The state comes out within the energy gap, forming the intermediate level. This intermediate level shits to an energy level higher than the Fermi level, and is, therefore, not occupied by electrons.

Figure 4:
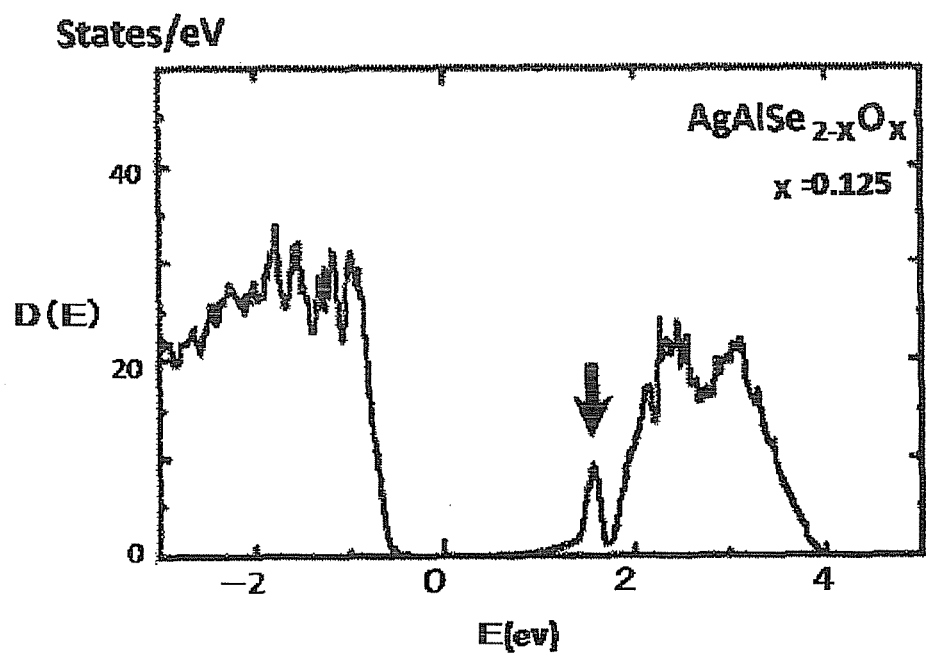
Figure 5:
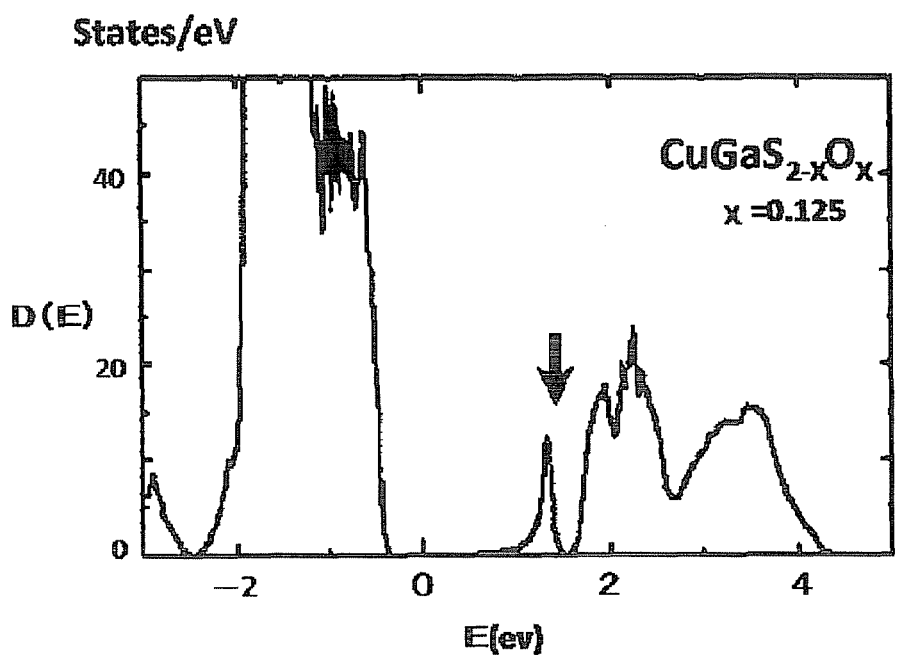
Figure 6:
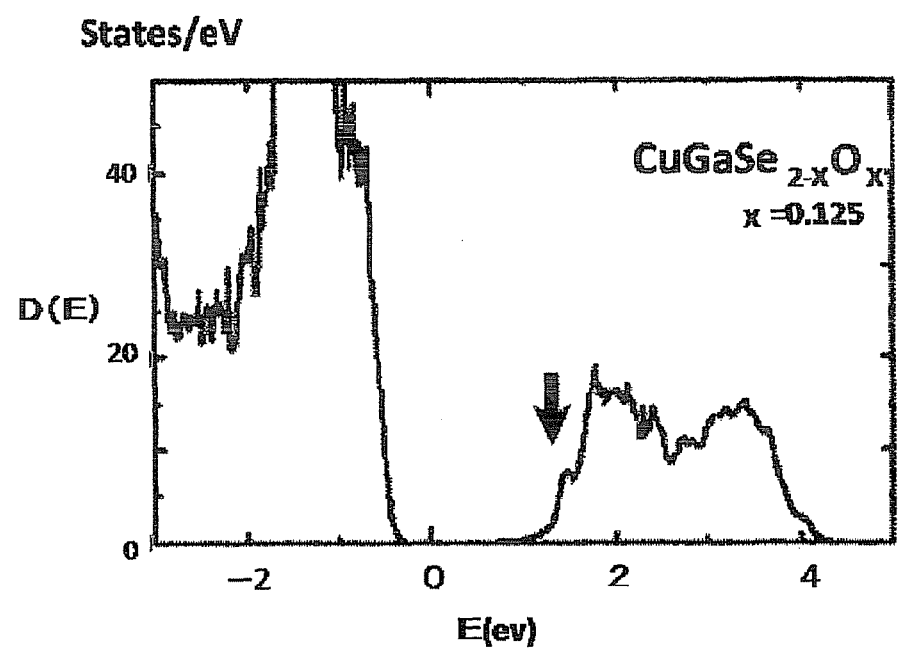
Figure 7:
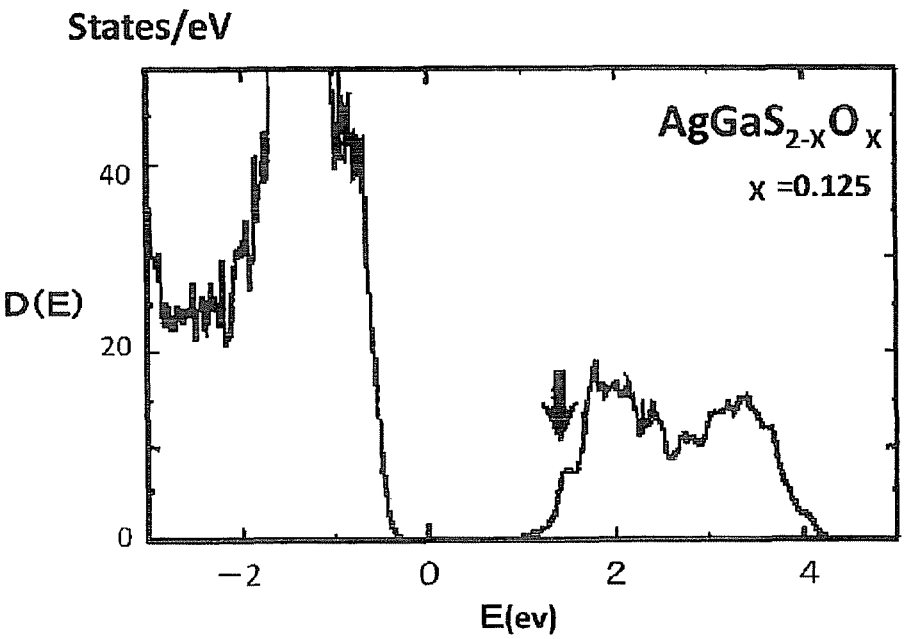
Figure 8:
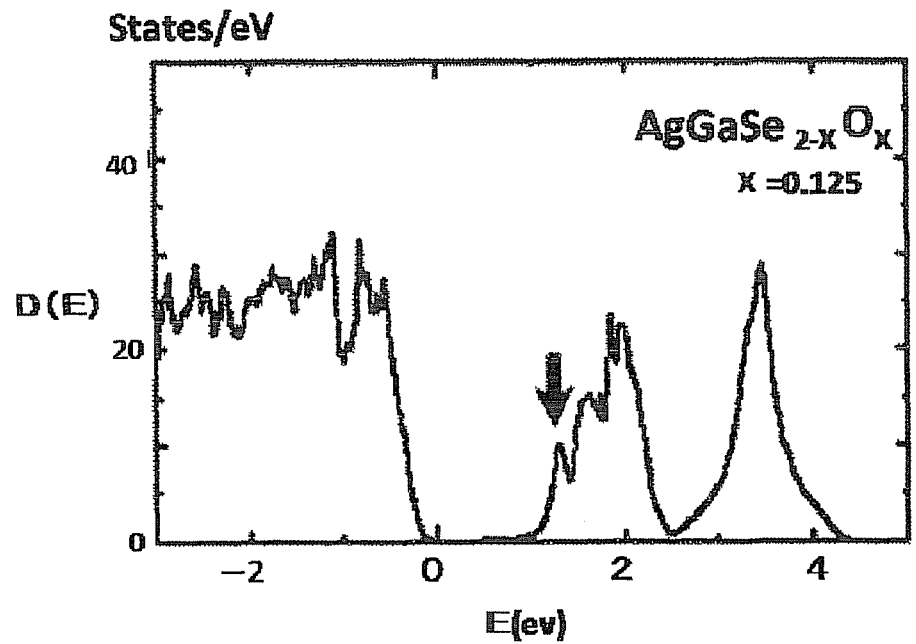
Figure 9:
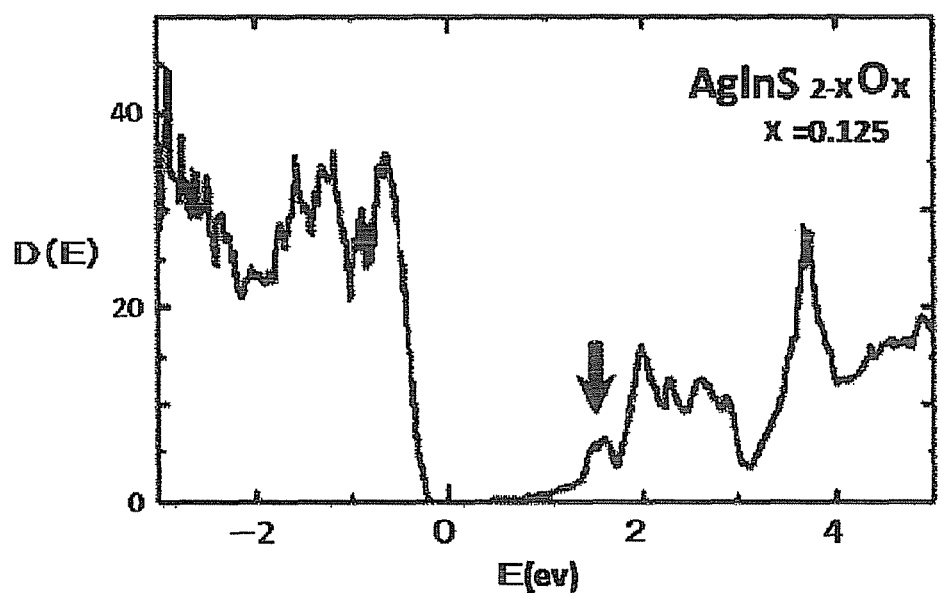
Figure 10:
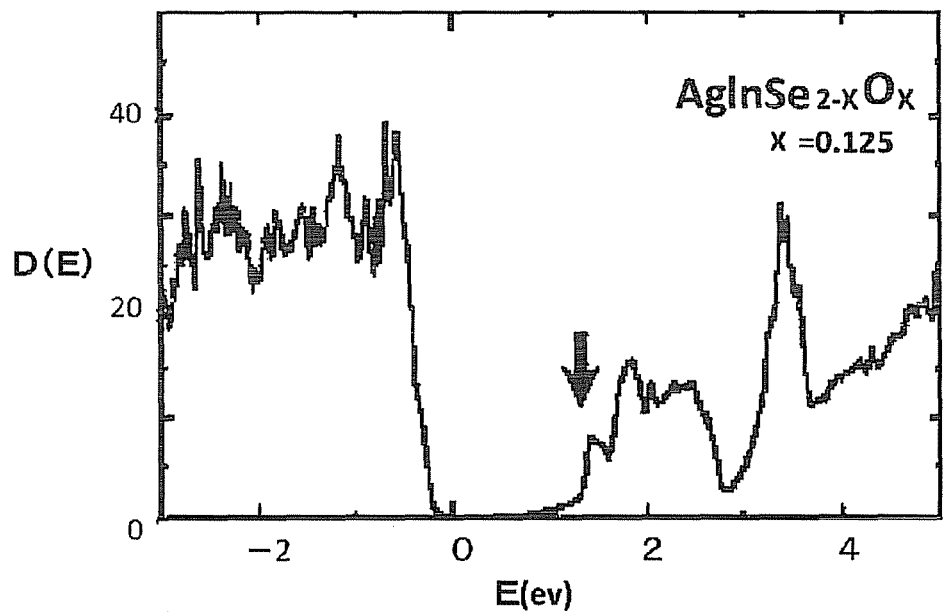
Figure 11:
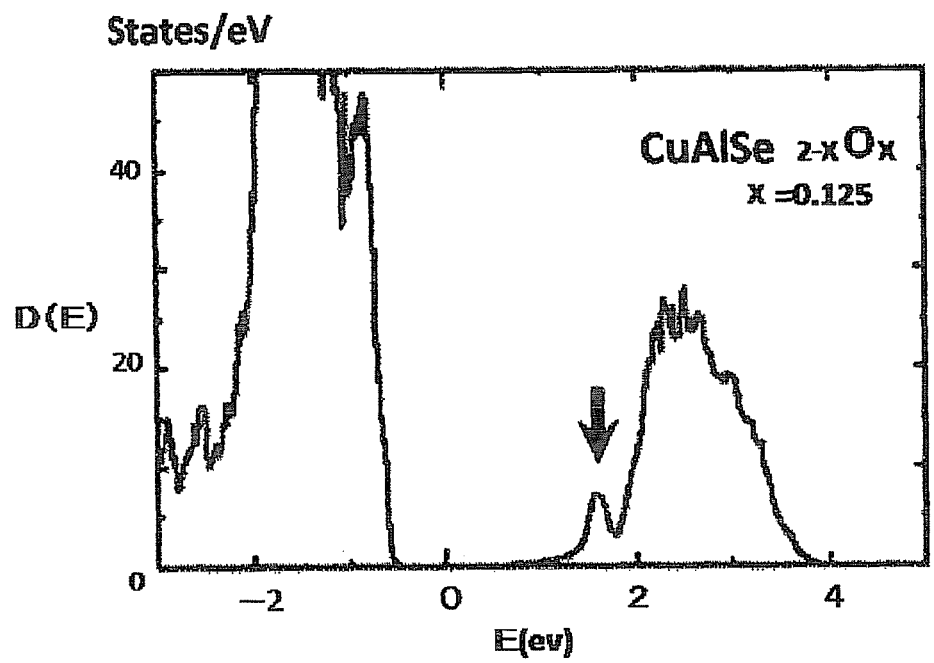
Figure 12:
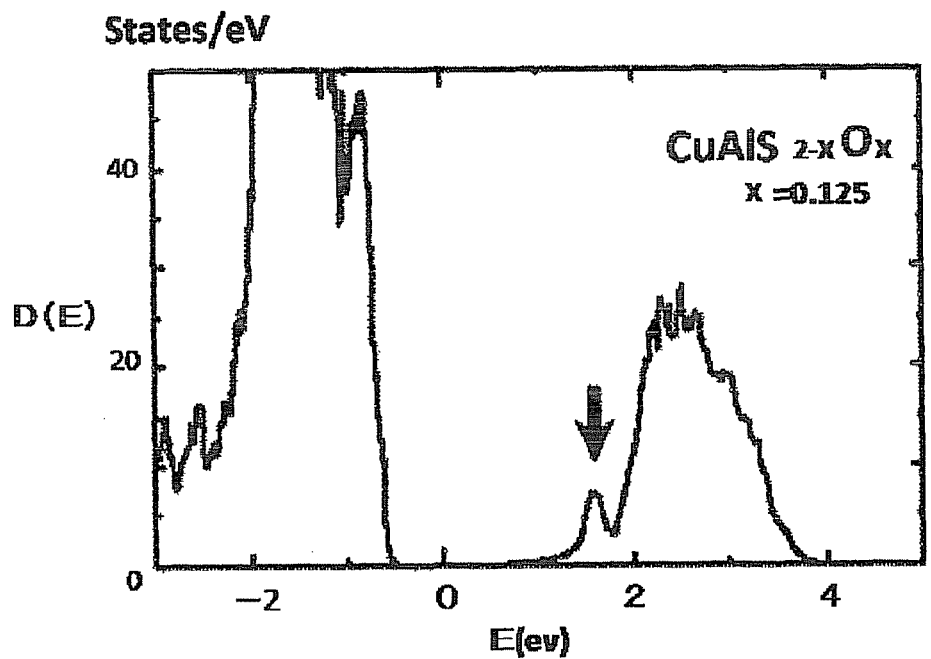
Figure 13:
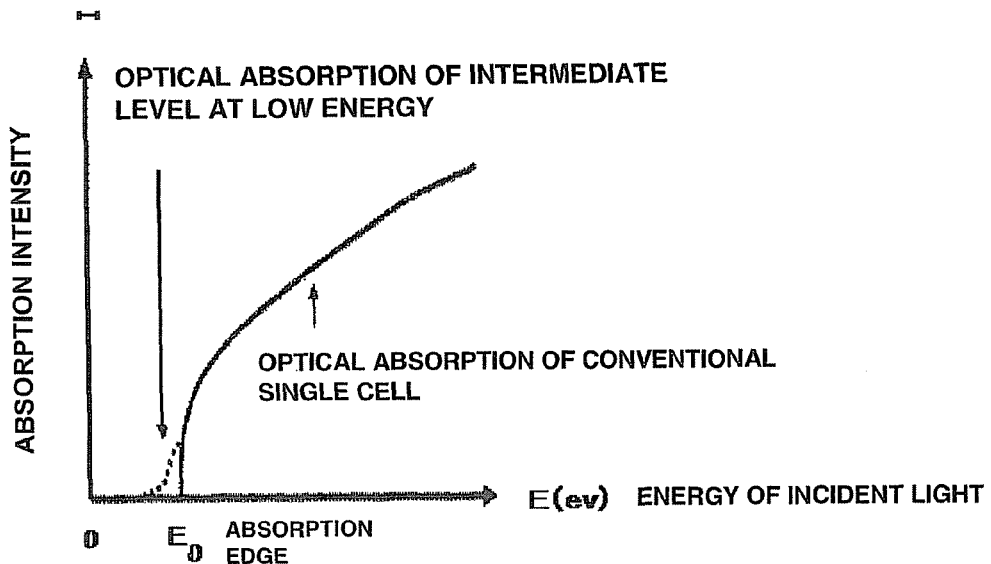
FIG. 13 is a schematic view showing an enhancement of the optical absorption property.

The oxygen substitution is not an impurity doping, but consistently a substitution. Consequently, the level formed within the energy gap is not an impurity level. The oxygen substitution allows it to create two or more energy gaps in the single solar cell, allowing it to obtain efficient light-absorbing materials. That is, the formation of the intermediate level allows the compound substituted with oxygen to absorb light additionally at lower energy, as shown in FIG. 4, thus the absorption edge thereof shifting to a lower energy side. FIG. 13 is a schematic view showing an enhancement of the optical absorption property. In this case of the oxygen substitution, when a substituted site has considerably a translational symmetry, band dispersion may be generated to allow carriers excited to the intermediate level to make band conduction. Furthermore, a localized electronic orbital such as d-orbital is important for the formation of the intermediate level, the d-electron being included in the I-element of the CIS constituent. It cannot be expected to form the intermediate level based on widespread orbitals such as s- and p-orbitals. In order to give business solutions according to the invention, the above results are summarized to allow it to select the candidates of material under the following conditions.

(1) The material basically has a CIS structure, and respective atoms constitute tetrahedron structure (diamond structure).
(2) VI-elements of the CIS compound are substituted with elements having electronegativity different from that of the VI-elements.
(3) In order to create the intermediate levels, it is important that the I-elements of the CIS compound include d-electrons.

When the above 3 conditions are taken into account, the candidates of material are summarized as shown in TABLES 1, 2 and 3. The calculation was carried out on the typical materials selected from the tables, yielding the results as shown in FIGS. 3 to 12 to show an energy-gap intermediate level. FIGS. 3 to 12 are graphs showing the calculations of density of states for the candidate compounds such as $CuAlS_{2-x}O_x$, $AgAlSe_{2-x}O_x$ (x=0.125: the substitution rate of oxygen is 6.25% to sulfur.) after the oxygen substitution. The horizontal axis is represented in eV, and the original point is set to the Fermi level. The intermediate level coalesces mostly with the conduction band in some materials, whereas the intermediate level is separated from the conduction band to appear clearly in other materials. The following is deduced from FIGS. 3 to 12. There are two types of compounds listed in TABLES 1, 2 and 3. The intermediate level formed by the oxygen substitution clearly appears on the E(eV) vs. D(E) graphs in one type, whereas the intermediate level does not appear clearly owing to the overlap thereof with the conduction band in the other type accompanied by the existence of what appears to be the intermediate level. Then, the substitution effect was evaluated for the samples listed in TABLES 1, 2 and 3. The degree of the effect for the respective samples was denoted as a ranking of A or B, A and B representing high and low effectiveness, respectively, as shown in the tables. The samples with ranking A show a clear difference between the intermediate level and the conduction band, whereas the samples with ranking B shows coalescence between the intermediate level and the conduction band. The conversion efficiency is estimated from the effect of the intermediate level and the previous theoretical calculations, overwhelming a conversion efficiency of normal single-solar cells. According to the present invention, embodiments are provided as follows. The intermediate level is different from an impurity level.

(1) The invention provides a solar cell including a p-n junction formed by joining a p-type semiconductor and an n-type semiconductor. Here, the p-type semiconductor is a chalcopyrite compound semiconductor with a band gap of 1.5 eV or more within which an intermediate level exists with a half bandwidth of 0.05 eV or more. The intermediate level is different from impurity levels.

(2) The invention also provides the solar cell in the above description (1), of which chalcopyrite compound semiconductor includes a first element having first electronegativity of 1.9 or more in Pauling units, the first element occupying a lattice site of the semiconductor. Here, a portion of the first element is substituted with a second element having second electronegativity different from the first electronegativity, the second element being a congeneric element of the first element. In addition, the intermediate level is created by substituting the first element with the second element.

(3) The invention also provides the solar cell in the above description (1), of which p-type semiconductor has a chemical formula of $ABC_2$, "A" representing a chemical symbol for copper or silver, "B" representing a chemical symbol for any one of gallium, indium and aluminum, "C" representing a chemical symbol for sulfur or selenium. In addition, a portion of "C" is substituted with oxygen.

(4) The invention also provides the solar cell in the above description (1), of which n-type semiconductor includes at least one of cadmium sulfide (CdS), zinc selenide (ZnSe), zinc oxide (ZnO) and zinc sulfide (ZnS). In addition, the surface of the n-type semiconductor is provided with a transparent electrode including at least one of zinc oxide, indium oxide, tin oxide and a mixture of these.

The solar cell according to the present invention is explained in detail with reference to accompanying drawings and tables. The same reference numerals denote the same parts. The examples of the present invention are summarized in TABLES 1, 2, and 3. TABLES 1, 2, and 3 list various candidate substances to create intermediate levels by substituting with oxygen.

TABLE 1

| | p-TYPE | n-TYPE | MANUFACTURING METHOD | EFFECT |
|---|---|---|---|---|
| EXAMPLE 1 | $CuGaS_{2-x}O_x$ | ZnO | 1 | A |
| EXAMPLE 2 | $CuGaSe_{2-x}O_x$ | ZnO | 1 | B |
| EXAMPLE 3 | $CuAlS_{2-x}O_x$ | ZnO | 1 | A |
| EXAMPLE 4 | $CuAlSe_{2-x}O_x$ | ZnO | 1 | A |
| EXAMPLE 5 | $CuInS_{2-x}O_x$ | ZnO | 1 | B |
| EXAMPLE 6 | $CuInSe_{2-x}O_x$ | ZnO | 1 | B |
| EXAMPLE 7 | $AgGaS_{2-x}O_x$ | ZnO | 1 | B |
| EXAMPLE 8 | $AgGaSe_{2-x}O_x$ | ZnO | 1 | B |
| EXAMPLE 9 | $AgAlS_{2-x}O_x$ | ZnO | 1 | A |
| EXAMPLE 10 | $AgAlSe_{2-x}O_x$ | ZnO | 1 | A |
| EXAMPLE 11 | $AgInS_{2-x}O_x$ | ZnO | 1 | B |
| EXAMPLE 12 | $AgInSe_{2-x}O_x$ | ZnO | 1 | B |
| EXAMPLE 13 | $CuGaS_{2-x}O_x$ | ZnSe | 1 | A |
| EXAMPLE 14 | $CuGaSe_{2-x}O_x$ | ZnSe | 1 | B |
| EXAMPLE 15 | $CuAlS_{2-x}O_x$ | ZnSe | 1 | A |
| EXAMPLE 16 | $CuAlSe_{2-x}O_x$ | ZnSe | 1 | A |
| EXAMPLE 17 | $CuInS_{2-x}O_x$ | ZnSe | 1 | B |
| EXAMPLE 18 | $CuInSe_{2-x}O_x$ | ZnSe | 1 | B |
| EXAMPLE 19 | $AgGaS_{2-x}O_x$ | ZnSe | 1 | B |
| EXAMPLE 20 | $AgGaSe_{2-x}O_x$ | ZnSe | 1 | B |
| EXAMPLE 21 | $AgAlS_{2-x}O_x$ | ZnSe | 1 | A |
| EXAMPLE 22 | $AgAlSe_{2-x}O_x$ | ZnSe | 1 | A |
| EXAMPLE 23 | $AgInS_{2-x}O_x$ | ZnSe | 1 | B |
| EXAMPLE 24 | $AgInSe_{2-x}O_x$ | ZnSe | 1 | B |

TABLE 2

| | p-TYPE | n-TYPE | MANUFACTURING METHOD | EFFECT |
|---|---|---|---|---|
| EXAMPLE 25 | $CuGaS_{2-x}O_x$ | ZnO | 2 | A |
| EXAMPLE 26 | $CuGaSe_{2-x}O_x$ | ZnO | 2 | B |
| EXAMPLE 27 | $CuAlS_{2-x}O_x$ | ZnO | 2 | A |
| EXAMPLE 28 | $CuAlSe_{2-x}O_x$ | ZnO | 2 | A |
| EXAMPLE 29 | $CuInS_{2-x}O_x$ | ZnO | 2 | B |
| EXAMPLE 30 | $CuInSe_{2-x}O_x$ | ZnO | 2 | B |
| EXAMPLE 31 | $AgGaS_{2-x}O_x$ | ZnO | 2 | B |
| EXAMPLE 32 | $AgGaSe_{2-x}O_x$ | ZnO | 2 | B |
| EXAMPLE 33 | $AgAlS_{2-x}O_x$ | ZnO | 2 | A |
| EXAMPLE 34 | $AgAlSe_{2-x}O_x$ | ZnO | 2 | A |
| EXAMPLE 35 | $AgInS_{2-x}O_x$ | ZnO | 2 | B |
| EXAMPLE 36 | $AgInSe_{2-x}O_x$ | ZnO | 2 | B |
| EXAMPLE 37 | $CuGaS_{2-x}O_x$ | ZnSe | 2 | A |
| EXAMPLE 38 | $CuGaSe_{2-x}O_x$ | ZnSe | 2 | B |
| EXAMPLE 39 | $CuAlS_{2-x}O_x$ | ZnSe | 2 | A |
| EXAMPLE 40 | $CuAlSe_{2-x}O_x$ | ZnSe | 2 | A |
| EXAMPLE 41 | $CuInS_{2-x}O_x$ | ZnSe | 2 | B |
| EXAMPLE 42 | $CuInSe_{2-x}O_x$ | ZnSe | 2 | B |
| EXAMPLE 43 | $AgGaS_{2-x}O_x$ | ZnSe | 2 | B |
| EXAMPLE 44 | $AgGaSe_{2-x}O_x$ | ZnSe | 2 | B |
| EXAMPLE 45 | $AgAlS_{2-x}O_x$ | ZnSe | 2 | A |
| EXAMPLE 46 | $AgAlSe_{2-x}O_x$ | ZnSe | 2 | A |
| EXAMPLE 47 | $AgInS_{2-x}O_x$ | ZnSe | 2 | B |
| EXAMPLE 48 | $AgInSe_{2-x}O_x$ | ZnSe | 2 | B |

TABLE 3

| | p-TYPE | n-TYPE | MANUFACTURING METHOD | EFFECT |
|---|---|---|---|---|
| EXAMPLE 49 | $CuGaS_{2-x}O_x$ | ZnO | 1 | A |
| EXAMPLE 50 | $CuGaSe_{2-x}O_x$ | ZnO | 1 | B |
| EXAMPLE 51 | $CuAlS_{2-x}O_x$ | ZnO | 1 | A |
| EXAMPLE 52 | $CuAlSe_{2-x}O_x$ | ZnO | 1 | A |
| EXAMPLE 53 | $CuInS_{2-x}O_x$ | ZnO | 1 | B |
| EXAMPLE 54 | $CuInSe_{2-x}O_x$ | ZnO | 1 | B |
| EXAMPLE 55 | $AgGaS_{2-x}O_x$ | ZnO | 1 | B |
| EXAMPLE 56 | $AgGaSe_{2-x}O_x$ | ZnO | 1 | B |
| EXAMPLE 57 | $AgAlS_{2-x}O_x$ | ZnO | 1 | A |

TABLE 3-continued

|  | p-TYPE | n-TYPE | MANU-FACTURING METHOD | EFFECT |
|---|---|---|---|---|
| EXAMPLE 58 | $AgAlSe_{2-x}O_x$ | ZnO | 1 | A |
| EXAMPLE 59 | $AgInS_{2-x}O_x$ | ZnO | 1 | B |
| EXAMPLE 60 | $AgInSe_{2-x}O_x$ | ZnO | 1 | B |
| EXAMPLE 61 | $CuGaS_{2-x}O_x$ | ZnSe | 1 | A |
| EXAMPLE 62 | $CuGaSe_{2-x}O_x$ | ZnSe | 1 | B |
| EXAMPLE 63 | $CuAlS_{2-x}O_x$ | ZnSe | 1 | A |
| EXAMPLE 64 | $CuAlSe_{2-x}O_x$ | ZnSe | 1 | A |
| EXAMPLE 65 | $CuInS_{2-x}O_x$ | ZnSe | 1 | B |
| EXAMPLE 66 | $CuInSe_{2-x}O_x$ | ZnSe | 1 | B |
| EXAMPLE 67 | $AgGaS_{2-x}O_x$ | ZnSe | 1 | B |
| EXAMPLE 68 | $AgGaSe_{2-x}O_x$ | ZnSe | 1 | B |
| EXAMPLE 69 | $AgAlS_{2-x}O_x$ | ZnSe | 1 | A |
| EXAMPLE 70 | $AgAlSe_{2-x}O_x$ | ZnSe | 1 | A |
| EXAMPLE 71 | $AgInS_{2-x}O_x$ | ZnSe | 1 | B |
| EXAMPLE 72 | $AgInSe_{2-x}O_x$ | ZnSe | 1 | B |

The substitution effect was evaluated for the examples listed in TABLES 1, 2 and 3. The degree of the effect for the respective examples was denoted as a ranking of A or B, A and B representing high and low effects, respectively, as shown in the tables. The samples with ranking A show a clear difference between the intermediate level and the conduction band, whereas the samples with ranking B shows coalescence between the intermediate level and the conduction band.

Figure 14:
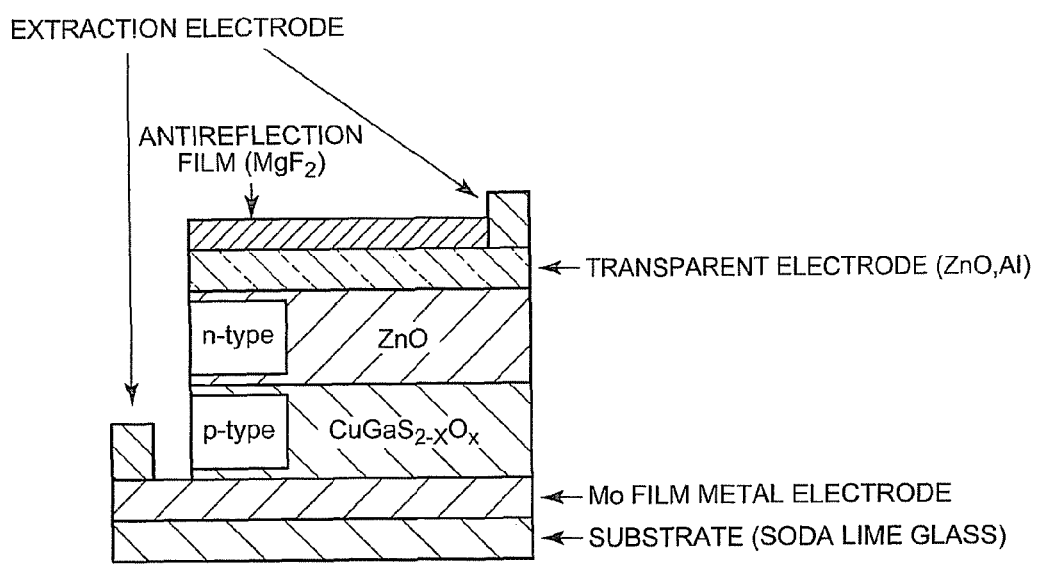
FIGS. 14 and 15 are sectional views showing a solar cell according to the invention.
Figure 15:
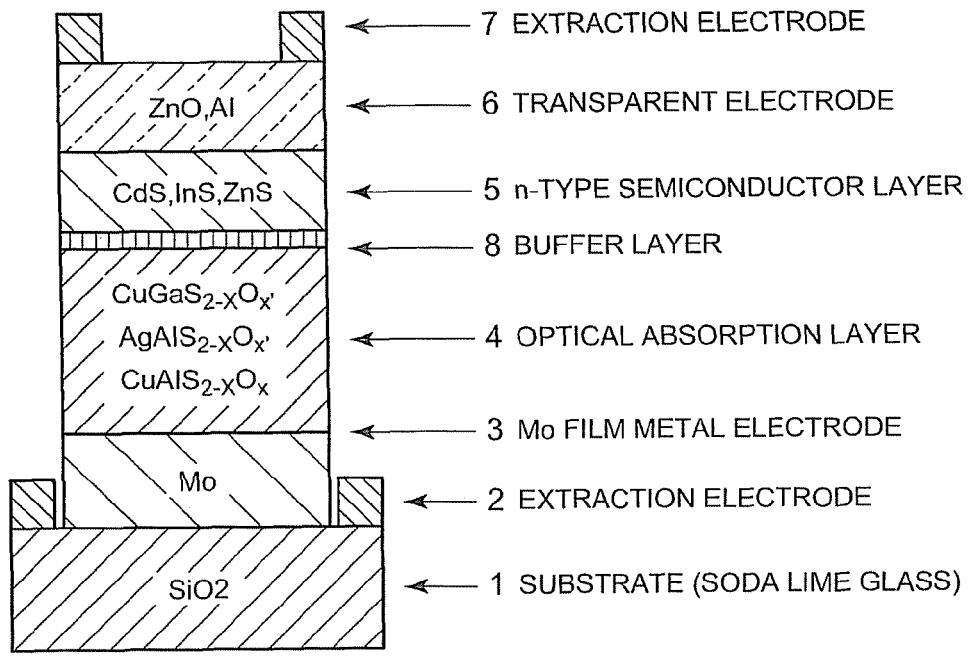

As the manufacturing method for the above-mentioned compound semiconductors, the method for characteristic $CuGaS_2$ and $AgAlSe_2$ is explained in detail. FIGS. 14 and 15 are sectional views conceptually and minutely showing a solar cell (photoelectromotive-force device), respectively. In FIG. 15, the numerals 1, 2, and 3 denote a substrate, an extraction electrode and a lower metal electrode, respectively. The numeral 4 denotes a CIS thin layer that is a first semiconductor layer including the intermediate level created by the oxygen substitution in the energy gap thereof. The numeral 5 denotes a second semiconductor layer formed of a CdS layer, a ZnO layer, a ZnS layer, etc. The numeral 6 denotes an upper transparent electrode formed of a ZnO layer, an AlO layer, etc. The numeral 7 denotes another extraction electrode.

Manufacturing methods 1 and 2 of the examples listed in TABLES 1, 2 and 3 are explained.

MANUFACTURING METHOD 1 for $CuGaS_{2-x}O_x$

The manufacturing method 1 corresponds to "1" in the column of the manufacturing method in TABLES 1, 2 and 3. The substrate 1 serves as a support medium, soda lime glass, etc. being employed. The substrate may be transparent like glass or non-transparent. The thickness of the substrate is preferably 10 mm or less in order to serve as a support medium. An extraction electrode 2 is prepared by vacuum deposition or sputtering. Silver, gold, aluminum, etc. are employed for the extraction electrode 2. As a lower metal electrode 3, substances are employed so as to serve as an electrode and to acquire adhesion to the first semiconductor layer. That is, molybdenum, tungsten, gold, nickel, platinum, etc. are employed for the extraction electrode 2. The lower metal electrode 3 is formed by sputtering one or more of the above substances between the glass substrate and the compound semiconductor layer for optical absorption.

The CIS thin layer 4 is a p-type chalcopyrite semiconductor $ABC_2$ ("A"=Cu, Ag; "B"=Ga, In, Al; "C"=S, Se) with a portion of "C" substituted with oxygen. The substitution rate of oxygen to the constituent "C" is preferably set to less than 12%. As the intrinsic element "B", an arbitrary combination of Ga, In and Al is available, allowing it to control the band gap of the intrinsic semiconductor unsubstituted with oxygen. An arbitrary combination of S and Se is also available for the intrinsic element "C" as well as "B", thus allowing it to obtain a similar effect to the above. As the manufacturing method of thin layers with the arbitrary combination of the intrinsic elements, a multi-source simultaneous-deposition method is employed. The multi-source simultaneous-deposition method is capable of forming the layer with an arbitrary composition by independently heating respective sources so as to make a prescribed composition. Ion beams are employed to introduce oxygen into the optical absorption layer.

Figure 16:
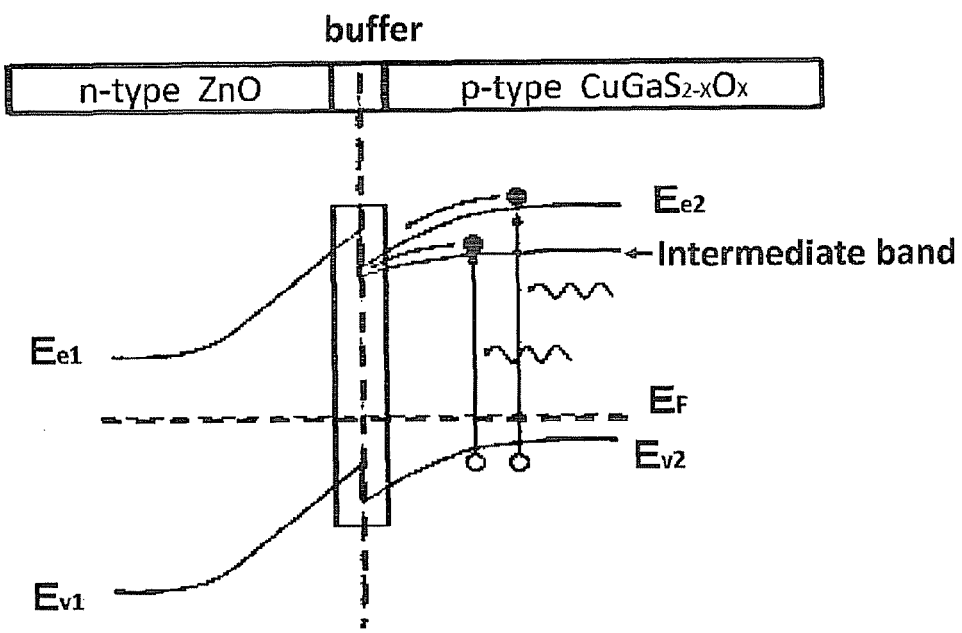
FIG. 16 is a schematic band diagram of a solar cell according to the invention.

The second semiconductor layer includes cadmium sulfide, zinc selenide, zinc oxide, or zinc sulfide. When a P-N junction is formed at the interface between the first and second semiconductor layers, it is important that electrons excited to the intermediate level in the first semiconductor layer have a finite mobility, as shown in FIG. 16. It is necessary to suppress a lattice mismatch existing between the first and second layers in order to avoid the unstable oxygen-substitution due to the lattice mismatch. It is considered that oxygen is stable even in the substituted CIS layer and the lattice mismatch due to a small amount of the oxygen substitution has less effect. Therefore, conventional material can be employed for the n-type compound semiconductor.

The metal electrode 3 is formed by sputtering under the first semiconductor layer which is an optical absorption layer. The thin buffer layer 8 made of, e.g., intrinsic CdS, i.e., the thin insulator layer is provided between the optical absorption layer and a second semiconductor n-type layer described below. The second semiconductor n-type layer 5 is formed on the thin buffer layer 8 using an electron beam evaporation method. The transparent electrode 6 is formed on the second semiconductor n-type layer 5 as a window layer. Silver, gold, copper and aluminum are employed for the extraction electrode 7, and the layer thereof are formed with vacuum deposition or sputtering for the extraction electrode 7, because the extraction electrode 7 is required to serve as a power collection electrode, as well as the extraction electrode 2.

Manufacturing Method 2 for $AgAlSe_{2-x}O_x$

The manufacturing method 2 corresponds to "2" in the column of the manufacturing method in TABLES 1, 2 and 3. The substrate 1 serves as a support medium, soda lime glass, etc. being employed. The substrate may be transparent like glass or non-transparent. The thickness of the substrate is preferably 10 mm in order to serve as a support medium. The extraction electrode 2 is prepared by vacuum deposition or sputtering. Silver, gold, aluminum, etc. are employed for the electrode 2. As the lower metal electrode 3, substances are employed so as to serve as an electrode and to acquire adhesion to the first semiconductor layer. That is, molybdenum, tungsten, gold, nickel, platinum, etc. are employed for the extraction electrode 2. The lower metal electrode 3 is formed by sputtering one or more of the above substances between the glass substrate and the compound semiconductor layer for optical absorption.

The CIS thin layer 4 is a p-type chalcopyrite semiconductor $ABC_2$ ("A"=Cu, Ag; "B"=Ga, In, Al; "C"=S, Se) with a portion of "C" substituted with oxygen. The substitution rate of oxygen to the constituent "C" is preferably set to less than 12%. As the intrinsic element "B", an arbitrary combination of Ga, In and Al is available, allowing it to control the band gap of the intrinsic semiconductor unsubstituted with oxygen. An arbitrary combination of S and Se is also available for the intrinsic element "C" as well as "B", thus allowing it to obtain a similar effect to the above.

As a method for controlling the combination of S and Se, selenization and sulfurization are employed. A metal precursor, e.g., Cu is deposited on a soda-lime-glass substrate by sputtering. Then, the substrate with Cu layer deposited thereon is annealed to form a compound semiconductor layer (a first semiconductor layer) with a prescribed composition due to the reaction of the precursor with selenium and sulfur. Ion beams are employed to introduce oxygen into the optical absorption layer.

The second semiconductor layer includes cadmium sulfide, zinc selenide, zinc oxide or zinc sulfide. When a P-N junction is formed at the interface between the first and second semiconductor layers, it is important that electrons excited to the intermediate level in the first semiconductor layer have a finite mobility, as shown in FIG. 16. It is necessary to suppress a lattice mismatch existing between the first and second layers in order to avoid unstable oxygen-substitution due to the lattice mismatch. It is considered that oxygen is stable even in the substituted CIS layer and the lattice mismatch due to a small amount of the oxygen substitution has less effect. Therefore, conventional material can be employed for the n-type compound semiconductor.

The metal electrode 3 is formed by sputtering under the first semiconductor layer which is an optical absorption layer. The thin buffer layer 8 made of, e.g., intrinsic CdS, i.e., the thin insulator layer is provided between the optical absorption layer and a second semiconductor n-type layer described below. The second semiconductor n-type layer 5 is formed on the thin buffer layer 8 using an electron beam evaporation method. The transparent electrode 6 is formed on the second semiconductor n-type layer 5 as a window layer. Silver, gold, copper and aluminum are employed for the extraction electrode 7, and the layer thereof are formed with vacuum deposition or sputtering for the extraction electrode 7, because the extraction electrode 7 is required to serve as a power collection electrode, as well as the extraction electrode 2.

Additional advantages and modifications may readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solar cell comprising:
a p-n junction formed by joining a p-type semiconductor and an n-type semiconductor, the p-type semiconductor being a chalcopyrite compound semiconductor with a band gap of 1.5 eV or more within which an intermediate level exists with a half bandwidth of 0.05 eV or more, wherein
the p-type semiconductor has a chemical formula of $ABC_2$, "A" representing a chemical symbol for copper occupying a lattice site of the chalcopyrite compound semiconductor, "B" representing a chemical symbol for any one of gallium and aluminum occupying a lattice site of the chalcopyrite compound semiconductor, "C" representing a chemical symbol for sulfur or selenium occupying a lattice site of the chalcopyrite compound semiconductor; and wherein
6.25 atomic percent to 12 atomic percent of "C" occupying a lattice site of the chalcopyrite compound semiconductor is substituted with oxygen.

2. The cell according to claim 1, wherein the chalcopyrite compound semiconductor includes a first element having first electronegativity of 1.9 or more in Pauling units, the first element occupying a lattice site of the chalcopyrite compound semiconductor; wherein a portion of the first element is substituted with a second element having second electronegativity different from the first electronegativity, the second element being a congeneric element of the first element; and wherein the intermediate level is created by substituting the first element with the second element.

3. The cell according to claim 1, wherein the n-type semiconductor includes at least one of cadmium sulfide (CdS), zinc selenide (ZnSe), zinc oxide (ZnO) and zinc sulfide (ZnS); and wherein
a surface of the n-type semiconductor is provided with a transparent electrode including at least one of zinc oxide, indium oxide and tin oxide.

4. The cell according to claim 1, wherein the portion of "C" substituted with oxygen creates two or more energy gaps in the cell.

* * * * *